US011432403B2

(12) United States Patent
Fujima et al.

(10) Patent No.: US 11,432,403 B2
(45) Date of Patent: Aug. 30, 2022

(54) PRINTED CIRCUIT BOARD

(71) Applicant: Mitsubishi Electric Corporation, Tokyo (JP)

(72) Inventors: Yoshiko Fujima, Tokyo (JP); Toshiki Asai, Tokyo (JP); Yusuke Morimoto, Tokyo (JP); Kohei Sato, Tokyo (JP); Shunsuke Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/252,792

(22) PCT Filed: Feb. 13, 2019

(86) PCT No.: PCT/JP2019/005143
§ 371 (c)(1),
(2) Date: Dec. 16, 2020

(87) PCT Pub. No.: WO2020/021743
PCT Pub. Date: Jan. 30, 2020

(65) Prior Publication Data
US 2021/0267056 A1    Aug. 26, 2021

(30) Foreign Application Priority Data
Jul. 26, 2018 (JP) .............................. JP2018-140332

(51) Int. Cl.
*H05K 1/18* (2006.01)
*H05K 1/11* (2006.01)
*H05K 1/14* (2006.01)

(52) U.S. Cl.
CPC .............. *H05K 1/115* (2013.01); *H05K 1/14* (2013.01); *H05K 1/181* (2013.01); *H05K 2201/044* (2013.01)

(58) Field of Classification Search
CPC .......... H05K 1/115; H05K 1/14; H05K 1/181; H05K 2201/044
(Continued)

(56) References Cited

U.S. PATENT DOCUMENTS 5,455,742 A * 10/1995 Phoy ...................... H05K 3/366
174/250
7,154,761 B1 * 12/2006 Camerlo ................ H05K 1/141
361/796
(Continued)

FOREIGN PATENT DOCUMENTS

JP            4314809 B2     5/2004

OTHER PUBLICATIONS

International Search Report of the International Searching Authority dated Apr. 23, 2019 for the corresponding international application No. PCT/JP2019/005143 (and English translation).

*Primary Examiner* — Binh B Tran
(74) *Attorney, Agent, or Firm* — Posz Law Group, PLC

(57) ABSTRACT

A printed circuit board includes: a first insulating substrate having a mounting hole that penetrates through the first insulating substrate from a first surface to a second surface; a second insulating substrate including a connection portion; a first electrode provided on the second surface and disposed at an edge of the mounting hole; a second electrode provided on the connection portion and joined to the first electrode; and an electronic component provided on the second surface. A center of mass of the second insulating substrate is disposed on the first surface of the first insulating substrate. A center of mass of the electronic component is disposed on the second surface of the first insulating substrate. The electronic component has a weight equivalent to a weight of the second insulating substrate.

4 Claims, 8 Drawing Sheets

(58) Field of Classification Search
USPC .......................................................... 361/786
See application file for complete search history.

(56) References Cited

U.S. PATENT DOCUMENTS

2006/0049777 A1    3/2006  Kumagai et al.
2008/0080152 A1*  4/2008  Duppong ............... H05K 3/366
                                                                             361/760

* cited by examiner

PRINTED CIRCUIT BOARD

CROSS REFERENCE TO RELATED APPLICATIONS

This application is a U.S. national stage application of PCT/JP2019/005143 filed on Feb. 13, 2019, which claims priority to Japanese patent application no, 2018-140332, filed on Jul. 26, 2018, the contents of which are incorporated herein by reference.

FIELD

The present invention relates to a printed circuit board including a plurality of insulating substrates.

BACKGROUND

PTL 1 discloses a printed circuit board. The printed circuit board disclosed in PTL 1 includes a mother board and an auxiliary board. The auxiliary board is inserted into a slit provided in the mother board. A terminal pad provided on the mother board and a terminal pad provided on the auxiliary board are connected by solder.

CITATION LIST

Patent Literature

[PTL 1] JP 4314809 B2

SUMMARY

Technical Problem

In the printed circuit board disclosed in PTL 1, however the auxiliary board perpendicularly protrudes from the mother board, and weight balance of the printed circuit board is biased to the auxiliary board side. For example, in a case where the printed circuit board is mounted on a device that generates vibration during operation, such as a compressor mounting device, vibration generated by operation of the device is transmitted to vibrate the printed circuit board. At this time, since the weight balance of the printed circuit board is biased to the auxiliary board side as described above, vibration of the auxiliary board is amplified. As a result of amplification of vibration of the auxiliary board, fixing between the auxiliary board and the mother board by the solder may be released.

The present invention is made to solve such issues. An object of the present invention is to provide a printed circuit board that includes a plurality of substrates combined to be orthogonal to one another, and makes it possible to prevent vibration of a specific substrate from being amplified and to prevent fixing of the plurality of substrates by solder from being released without increasing an entire weight of the printed circuit board.

Solution to Problem

A printed circuit board according to the present invention includes: a first insulating substrate having a mounting hole therein, the mounting hole penetrating through the first insulating substrate from a first surface to a second surface and having a width larger in a second direction than in a first direction orthogonal to the second direction; a second insulating substrate including a connection portion, the connection portion penetrating through the mounting hole from the first surface side and protruding from the second surface; a first electrode provided on the second surface and disposed at an edge of the mounting hole along the second direction; a second electrode provided on the connection portion and joined to the first electrode by solder; and an electronic component provided on the second surface, a center of mass of the second insulating substrate being disposed on the first surface side of the first insulating substrate, a center of mass of the electronic component being disposed on the second surface side of the first insulating substrate, the electronic component having a weight equivalent to a weight of the second insulating substrate.

Advantageous Effects of Invention

According to the printed circuit board of the present invention, in the printed circuit board in which the plurality of substrates are combined to be orthogonal to one another, it is possible to prevent vibration of a specific substrate from being amplified and to prevent fixing of the plurality of substrates by solder from being released, without increasing the entire weight of the printed circuit board.

DESCRIPTION OF EMBODIMENTS

Figure 1:
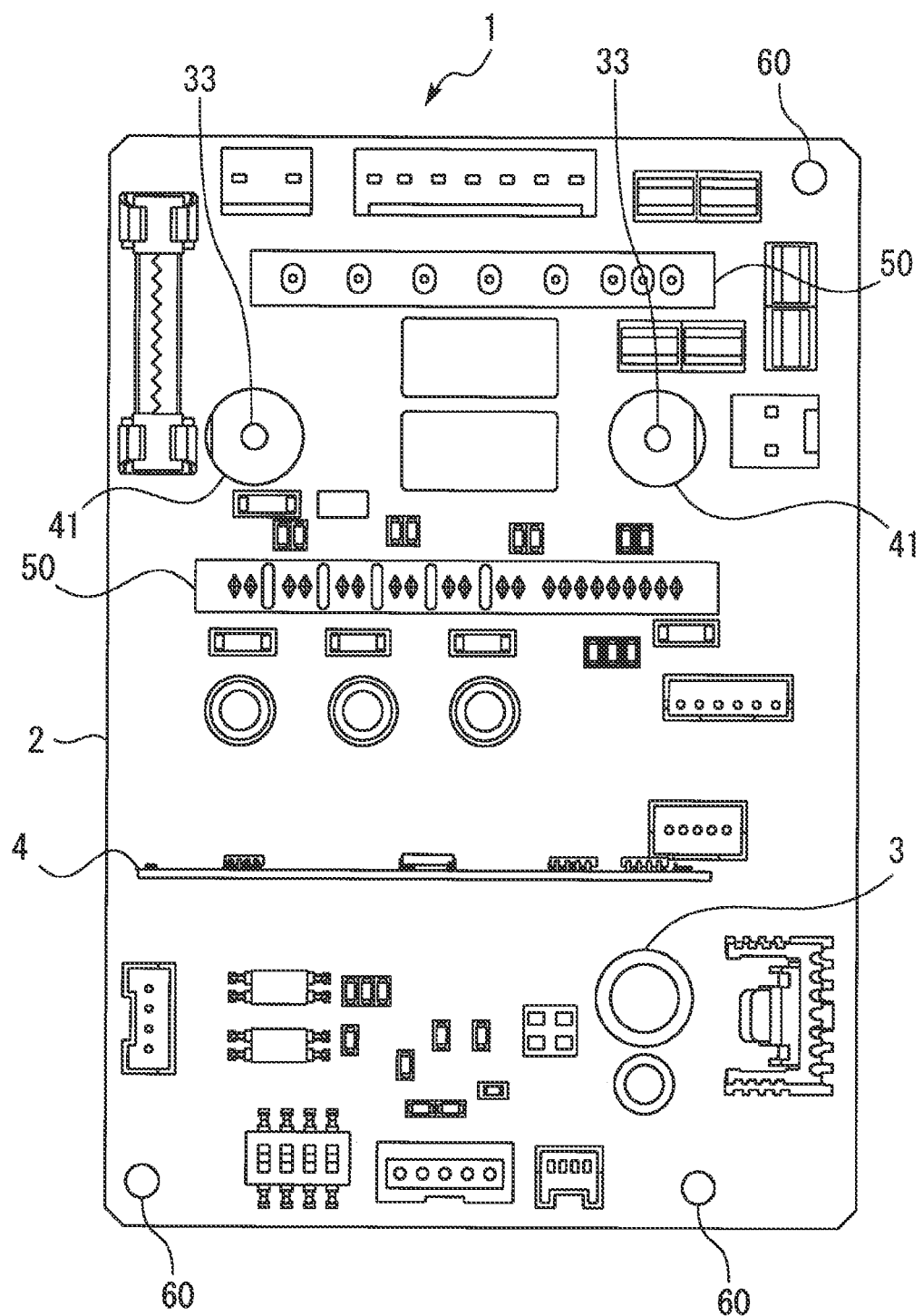
FIG. 1 is a top view of a printed circuit board according to Embodiment 1 of the present invention.

An embodiment of the present invention is described with reference to accompanying drawings. In the drawings, the same or equivalent parts are denoted by the same reference numerals, and repetitive descriptions are appropriately simplified or omitted. Note that the present invention is not limited to the following embodiment, and various modifications can be made without departing from the scope of the present invention.

Embodiment 1

Figure 2:
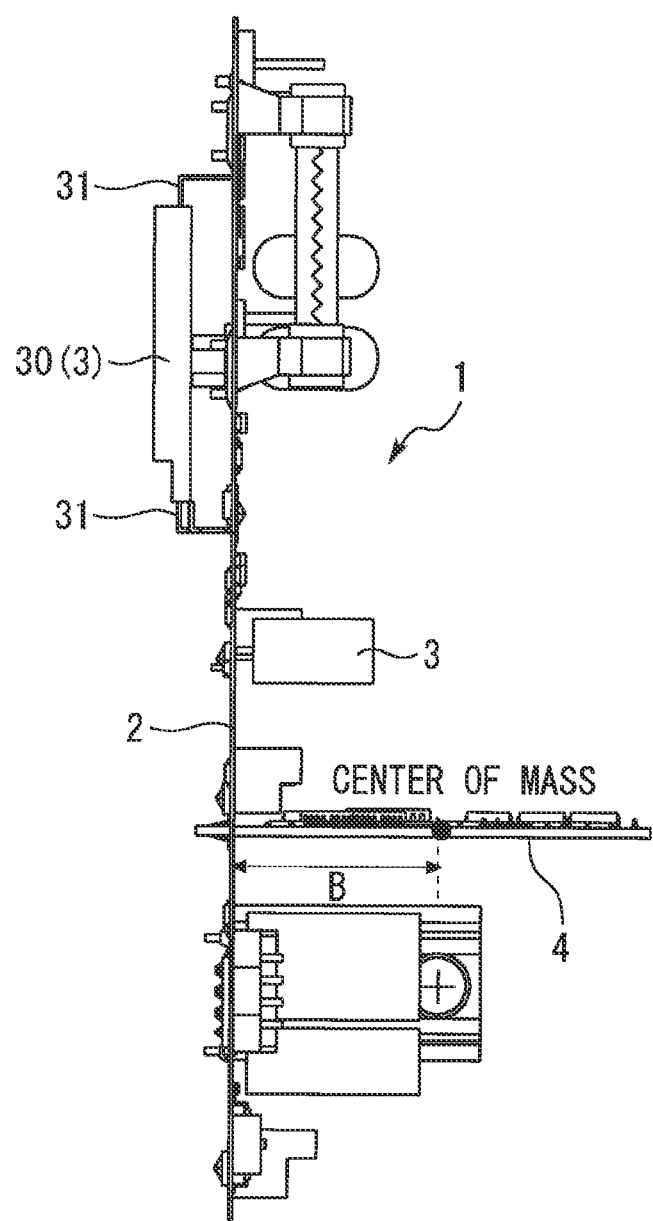
FIG. 2 is a side view of the printed circuit board according to Embodiment 1 of the present invention.
Figure 3:
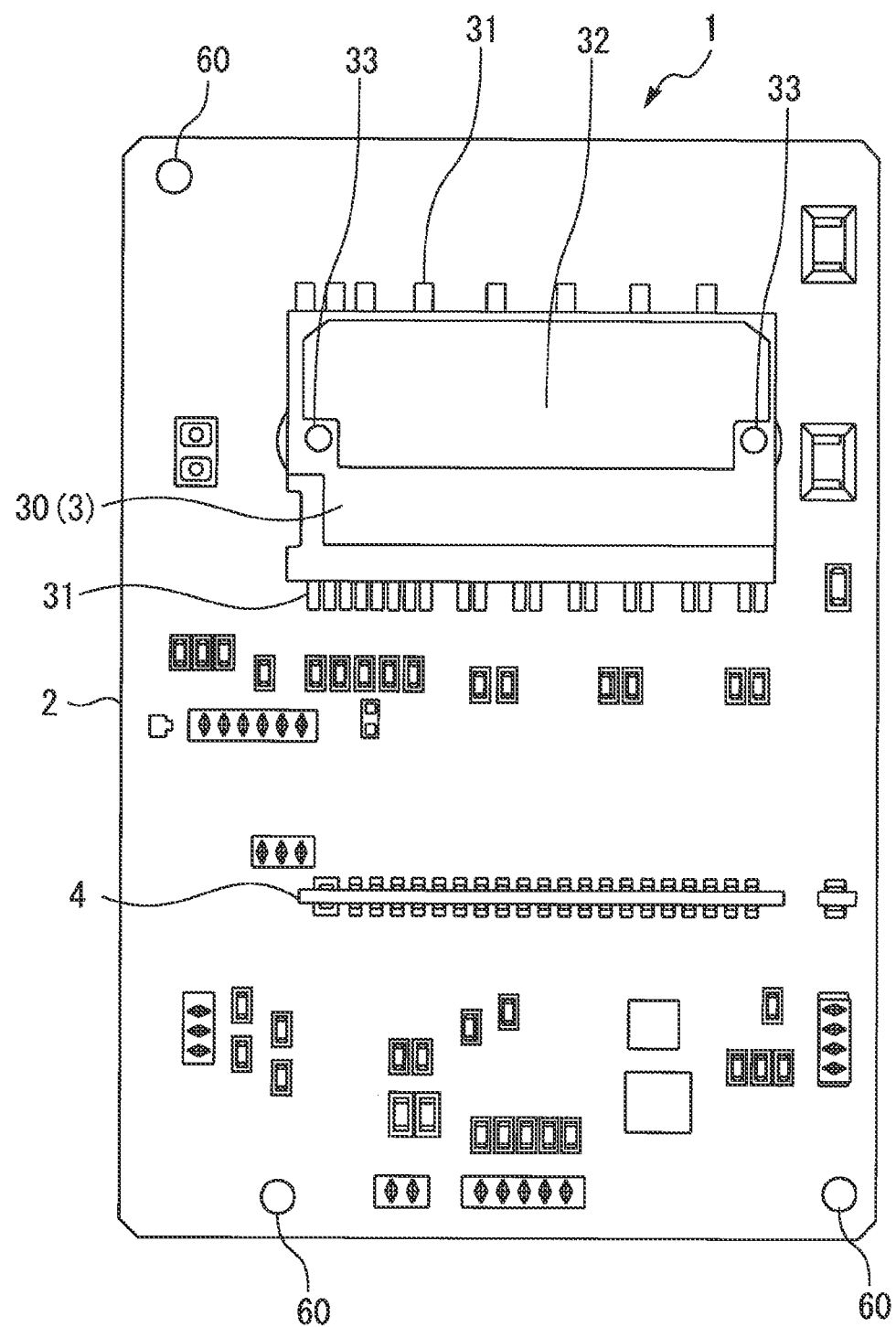
FIG. 3 is a bottom view of the printed circuit board according to Embodiment 1 of the present invention.
Figure 4:
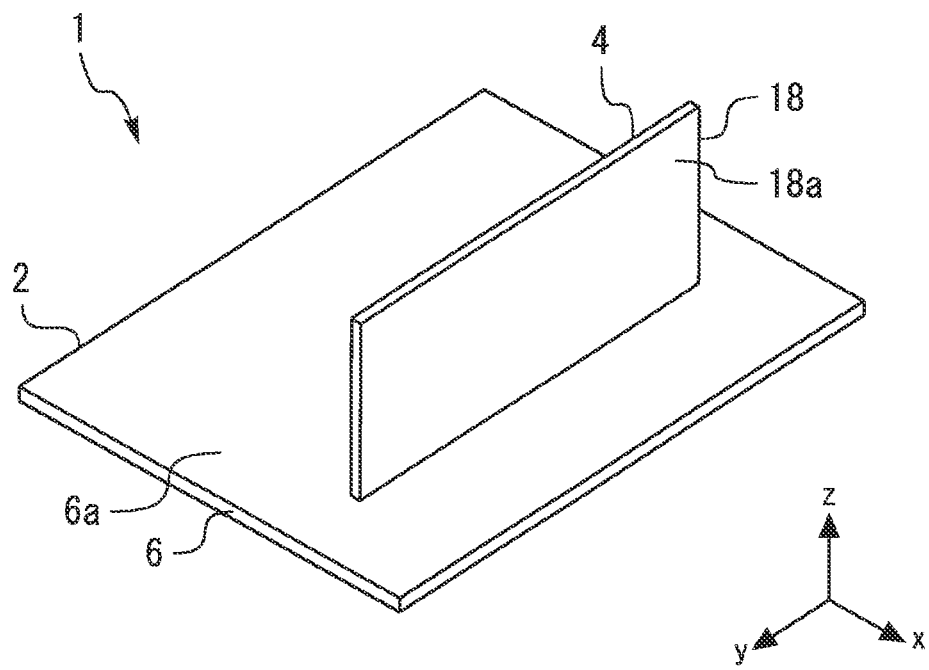
FIG. 4 is a perspective view schematically illustrating a main part of the printed circuit board according to Embodiment 1 of the present invention.
Figure 5:
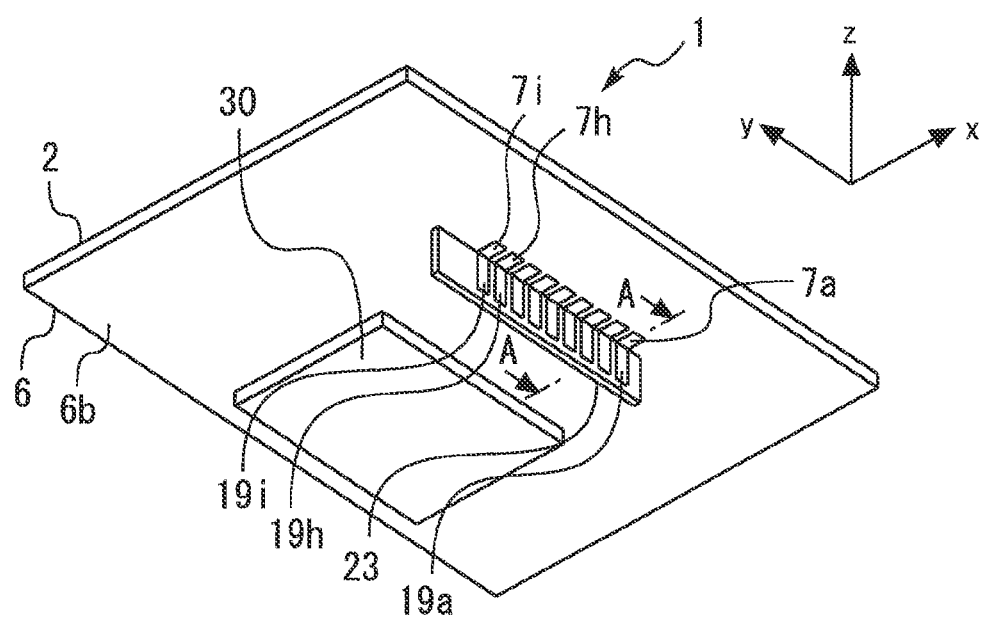
FIG. 5 is a perspective view schematically illustrating a main part of the printed circuit board according to Embodiment 1 of the present invention.
Figure 6:
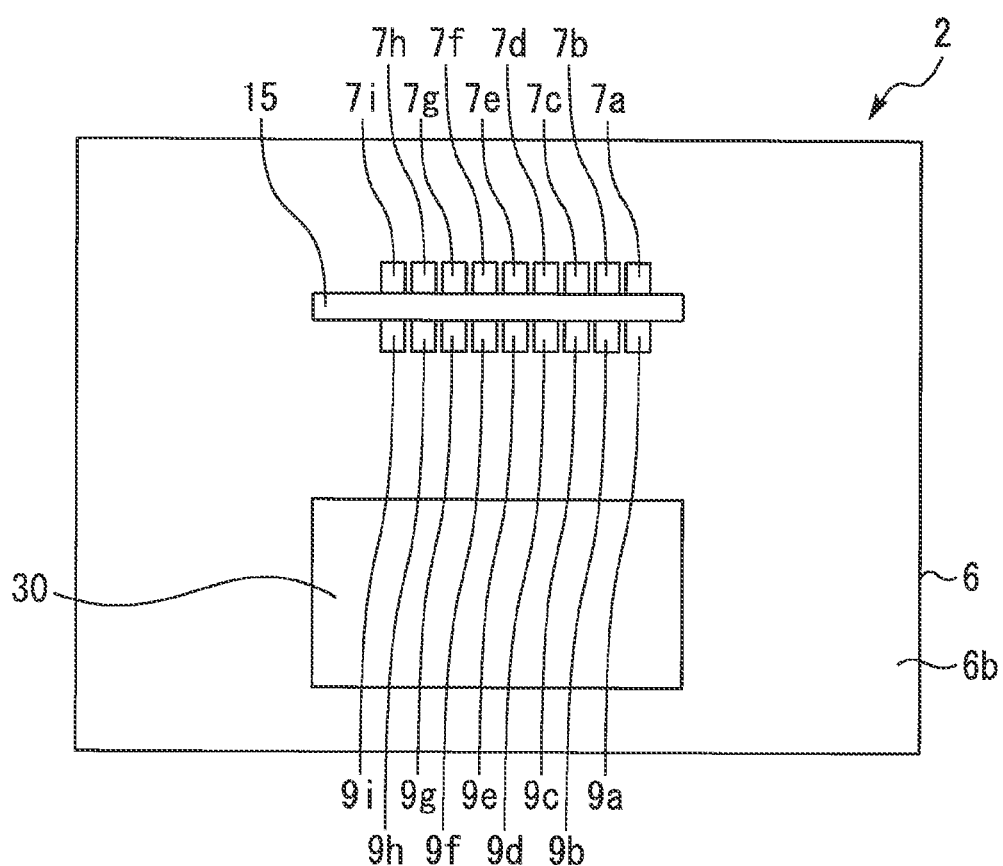
FIG. 6 is a bottom view schematically illustrating a main part of a first printed wiring board included in the printed circuit board according to Embodiment 1 of the present invention.
Figure 7:
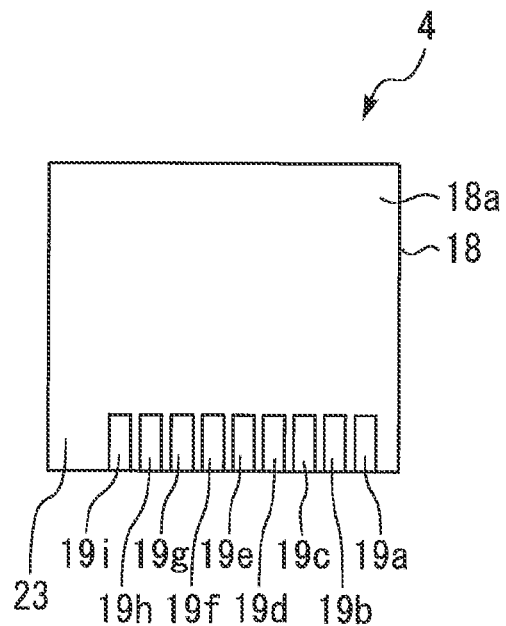
FIG. 7 is a front view schematically illustrating a main part of a second printed wiring board included in the printed circuit board according to Embodiment 1 of the present invention.
Figure 8:
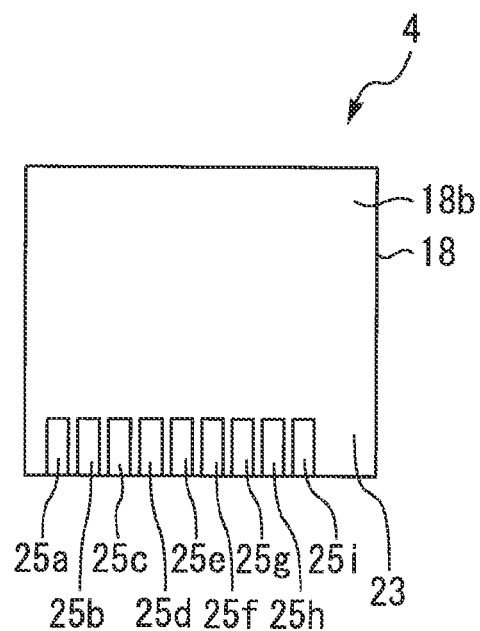
FIG. 8 is a back view schematically illustrating the main part of the second printed wiring board included in the printed circuit board according to Embodiment 1 of the present invention.
Figure 9:
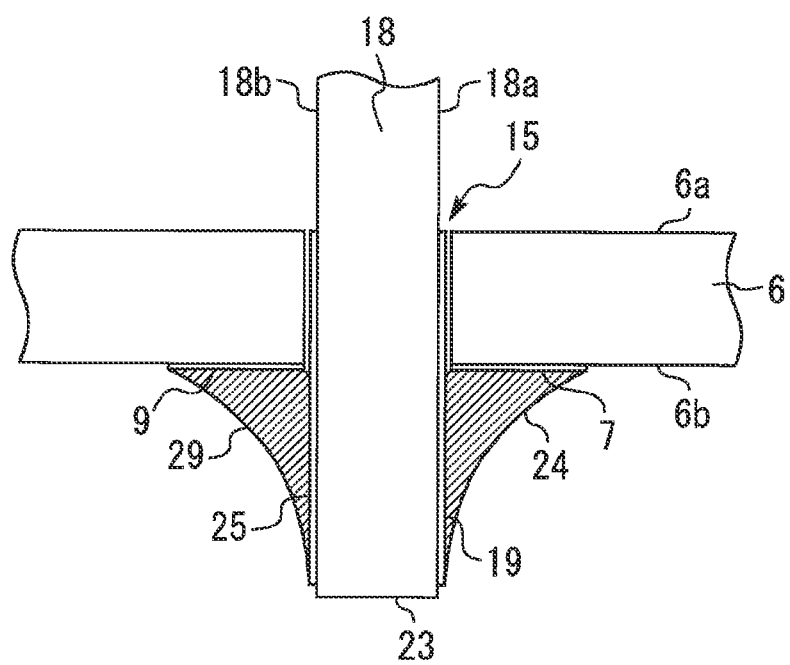
FIG. 9 is a cross-sectional view of the printed circuit board according to Embodiment 1 of the present invention taken along line A-A illustrated in FIG. 5
Figure 10:
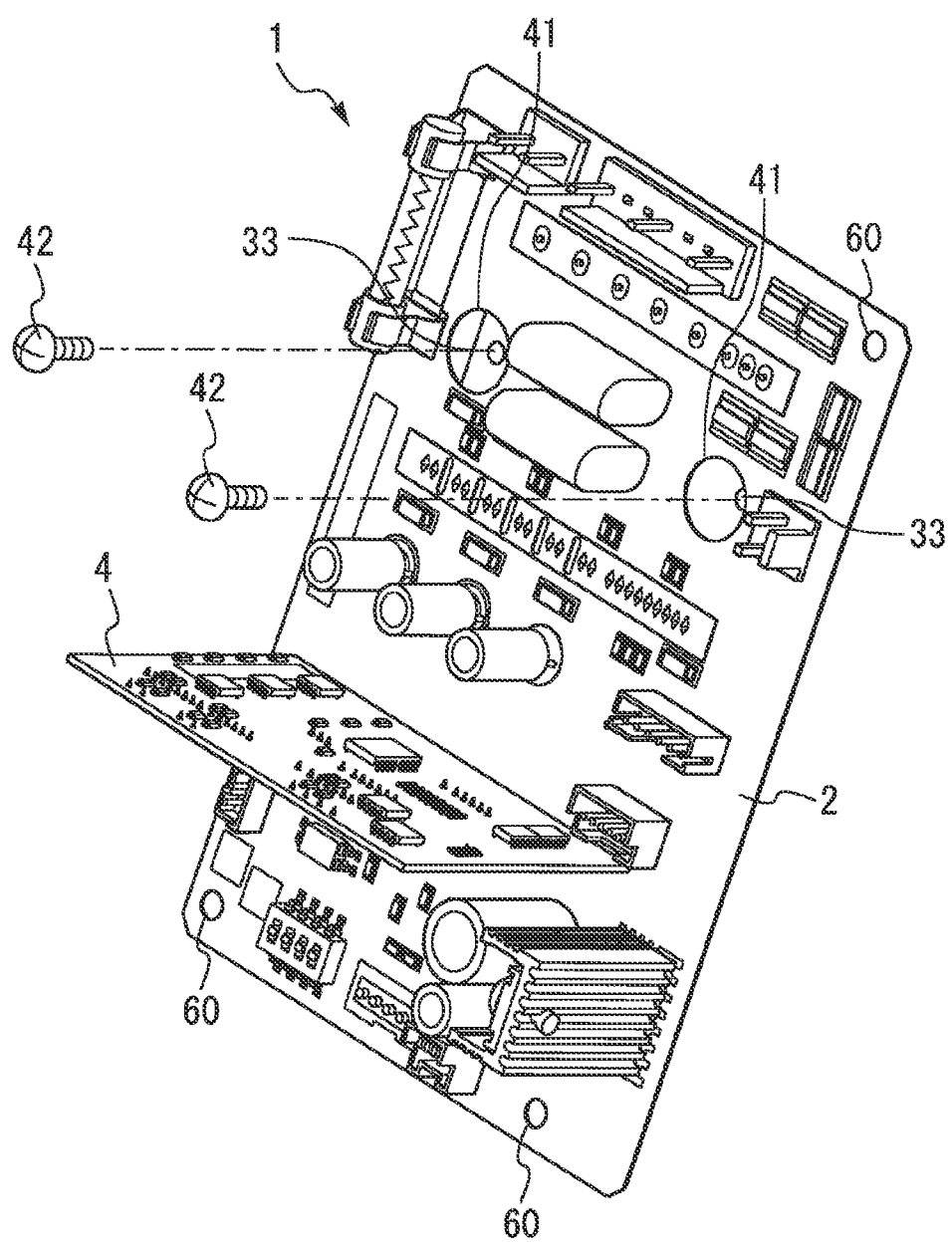
FIG. 10 is a perspective view of the printed circuit board according to Embodiment 1 of the present invention.

FIG. 1 to FIG. 10 relate to Embodiment 1 of the present invention. FIG. 1 is a top view of a printed circuit board. FIG. 2 is a side view of the printed circuit board. FIG. 3 is a bottom view of the printed circuit board. FIG. 4 and FIG. 5 are perspective views schematically illustrating a main part of the printed circuit board. FIG. 6 is a bottom view schematically illustrating a main part of a first printed wiring board included in the printed circuit board. FIG. 7 is a front view schematically illustrating a main part of a second printed wiring board included in the printed circuit board. FIG. 8 is a back view schematically illustrating the main part of the second printed wiring board included in the printed circuit board. FIG. 9 is a cross-sectional view of the printed circuit board taken along line A-A illustrated in FIG. 5. FIG. 10 is a perspective view of the printed circuit board.

For example, as illustrated in FIG. 1 to FIG. 3, a printed circuit board 1 according to the present embodiment includes a first printed wiring board 2 and a second printed wiring board 4. Various kinds of electronic components 3 are mounted on the first printed wiring board 2. In addition, various kinds of electronic components are mounted also on the second printed wiring board 4. The first printed wiring board 2 is larger than the second printed wiring board 4. As illustrated in FIG. 1 to FIG. 5, the second printed wiring board 4 is provided to be orthogonal to the first printed wiring board 2.

To facilitate understanding, an x-axis, a y-axis, and a z-axis are set as illustrated in FIG. 4 and FIG. 5. The x-axis, the y-axis, and the z-axis are orthogonal to one another.

As illustrated in FIG. 6, the first printed wiring board 2 includes a first insulating substrate 6, a plurality of first electrodes 7, and a plurality of first electrodes 9. For example, the first insulating substrate 6 has a plate shape with a constant thickness. As illustrated in FIG. 4 to FIG. 6, the first insulating substrate 6 includes a first surface 6a and a second surface 6b. The second surface 6b is a surface directed to a direction opposite to a direction of the first surface 6a. The x-axis is parallel to the first surface 6a and the second surface 6b. The y-axis is parallel to the first surface 6a and the second surface 6b. The z-axis is orthogonal to the first surface 6a and the second surface 6b.

A power module 30 is mounted on the first printed wiring board 2. The power module 30 is one of the various kinds of electronic components 3 described above. The power module 30 is provided on the second surface 6b side of the first insulating substrate 6. The other electronic components 3 are basically provided on the first surface 6a side. Therefore, the electronic component 3 (power module 30) is provided at least on the second surface 6b side of the first insulating substrate 6.

The power module 30 includes a plurality of leads 31. The power module 30 as a kind of the electronic components 3 is mounted on the first insulating substrate 6 in such a manner that the leads 31 are inserted into the first insulating substrate 6 from the second surface 6b side. As illustrated in FIG. 1, the leads 31 of the power module 30 are soldered at lead mounting portions 50 provided on the first surface 6a of the first insulating substrate 6. Further, as illustrated in FIG. 3, a heatsink 32 is provided on a top surface of the power module 30. The heatsink 32 discharges heat generated inside the power module 30, to outside of the power module 30.

The mounting hole 15 is provided in the first insulating substrate 6. The mounting hole 15 is a hole to mount the second printed wiring board 4 on the first printed wiring board 2. The mounting hole 15 penetrates through the first insulating substrate 6 from the first surface 6a to the second surface 6b. The mounting hole 15 is a long hole having a width that is larger in the y-axis direction than in the x-axis direction.

In the present embodiment, an example in which the first printed wiring board 2 includes nine first electrodes 7 is described. The number of first electrodes 7 included in the first printed wiring board 2 is not limited to nine. In the following description, the first electrodes 7 are denoted by reference numerals 7a to 7i to individually specify the first electrodes 7. The first electrodes 7a to 7i are provided on the second surface 6b of the first insulating substrate 6. The first electrodes 7a to 7i configure a part of a printed circuit provided on the first insulating substrate 6.

The first electrodes 7a to 7i are arranged in a straight line in the y-axis direction. The first electrodes 7a to 7i are arranged at an edge of the mounting hole 15. For example, the first electrode 7a is disposed at an end among the first electrodes 7a to 7i arranged in a line. The first electrode 7b is adjacent to the first electrode 7a. The first electrode 7c is adjacent to the first electrode 7b. Likewise, the first electrode 7h is adjacent to the first electrode 7g. The first electrode 7i is adjacent to the first electrode 7h. The first electrode 7i is disposed at an end among the first electrodes 7a and 7i arranged in a line.

In the present embodiment, an example in which the first printed wiring board 2 includes nine first electrodes 9 is described. The number of first electrodes 9 included in the first printed wiring board 2 is not limited to nine. In the following description, the first electrodes 9 are denoted by reference numerals 9a to 9i to individually specify the first electrodes 9. The first electrodes 9a to 9i are provided on the second surface 6b of the first insulating substrate 6. The first electrodes 9a to 9i configure a part of the printed circuit provided on the first insulating substrate 6.

The first electrodes 9a to 9i are arranged in a straight line in the y-axis direction. The first electrodes 9a to 9i are arranged at an edge of the mounting hole 15. The first electrodes 9a to 9i are arranged to respectively face the first electrodes 7a to 7i with the mounting hole 15 in between. For example, the first electrode 9a is disposed at an end among the first electrodes 9a to 9i arranged in a line. The first electrode 9a is disposed to face the first electrode 7a with the mounting hole 15 in between. The first electrode 9b is adjacent to the first electrode 9a. The first electrode 9b is disposed to face the first electrode 7b with the mounting hole 15 in between. Likewise, the first electrode 9h is adjacent to the first electrode 9g. The first electrode 9h is disposed to face the first electrode 7h with the mounting hole 15 in between. The first electrode 9i is adjacent to the first electrode 9h. The first electrode 9i is disposed to face the first electrode 7i with the mounting hole 15 in between. The first electrode 9i is disposed at an end among the first electrodes 9a to 9i arranged in a line.

FIG. 7 and FIG. 8 are diagrams illustrating an example of the second printed wiring board 4. As illustrated in these figures, the second printed wiring board 4 includes a second insulating substrate 18, a plurality of second electrodes 19, and a plurality of second electrodes 25.

For example, the second insulating substrate 18 has a plate shape with a constant thickness. The second insulating substrate 18 includes a surface 18a and a surface 18b. FIG. 7 is a diagram illustrating the second printed wiring board 4 as viewed from the surface 18a side of the second insulating substrate 18. The electronic components of the second printed wiring board 4 are disposed on, for example, the surface 18a side. The surface 18b is a surface directed to a direction opposite to a direction of the surface 18a. The y-axis is parallel to the surface 18a and the surface 18b. The z-axis is parallel to the surface 18a and the surface 18b. The x-axis is orthogonal to the surface 18a and the surface 18b.

The second insulating substrate 18 includes a connection portion 23. The connection portion 23 is provided at one end of the second insulating substrate 18. The connection portion 23 penetrates through the mounting hole 15 from the first surface 6a side, and protrudes from the second surface 6b of the first insulating substrate 6.

In the present embodiment, an example in which the second printed wiring board 4 includes nine second electrodes 19 is described. The number of second electrodes 19 included in the second printed wiring board 4 is not limited to nine. In the following description, the second electrodes 19 are denoted by reference numerals 19a to 19i to individually specify the second electrodes 19. The second electrodes 19a to 19i are provided on the surface 18a of the second insulating substrate 18. More specifically, the second electrodes 19a to 19i are provided on the surface 18a of the connection portion 23. The second electrodes 19a to 19i configure a part of a printed circuit provided on the second insulating substrate 18.

The second electrodes 19a to 19i are arranged in a straight line in the y-axis direction. The second electrodes 19a to 19i are arranged at an edge of the second insulating substrate 18. For example, the second electrode 19a is disposed at an end among the second electrodes 19a to 19i arranged in a line. The second electrode 19b is adjacent to the second electrode 19a. The second electrode 19c is adjacent to the second electrode 19b. The second electrode 19h is adjacent to the second electrode 19g. The second electrode 19i is adjacent to the second electrode 19h. The second electrode 19i is disposed at an end among the second electrodes 19a to 19i arranged in a line.

FIG. 8 is a diagram illustrating the second printed wiring board 4 as viewed from the surface 18b side that is a rear surface of the surface 18a. In the second printed wiring board 4, a configuration on the surface 18b side is similar to the configuration on the surface 18a side. In other words, the second printed wiring board 4 includes the plurality of second electrodes 25.

In the present embodiment, an example in which the second printed wiring board 4 includes nine second electrodes 25 is described. The number of second electrodes 25 included in the second printed wiring board 4 is not limited to nine. In the following description, the second electrodes 25 are denoted by reference numerals 25a to 25i to individually specify the second electrodes 25. The second electrodes 25a to 25i are provided on the surface 18b of the second insulating substrate 18. More specifically, the second electrodes 25a to 25i are provided on the surface 18b of the connection portion 23. The second electrodes 25a to 25i configure a part of the printed circuit provided on the second insulating substrate 18.

The second electrodes 25a to 25i are arranged in a straight line in the y-axis direction. The second electrodes 25a to 25i are arranged at an edge of the second insulating substrate 18. For example, the second electrode 25a is disposed at an end among the second electrodes 25a to 25i arranged in a line. The second electrode 25b is adjacent to the second electrode 25a. The second electrode 25h is adjacent to the second electrode 25g. The second electrode 25i is adjacent to the second electrode 25h. The second electrode 25i is disposed at an end among the second electrodes 25a to 25i arranged in a line.

The printed circuit board 1 is configured in the following manner by the first printed wiring board 2 and the second printed wiring board 4 having the above-described configurations. First, the second printed wiring board 4 is disposed to be orthogonal to the first printed wiring board 2. At this time, the connection portion 23 is inserted into the mounting hole 15 from the first surface 6a side, and is protruded from the second surface 6b of the first insulating substrate 6.

In this state, as illustrated in FIG. 5, the second electrodes 19a to 19i of the second insulating substrate 18 are disposed to be respectively adjacent to the first electrodes 7a to 7i provided on the first insulating substrate 6. FIG. 9 is a diagram illustrating a cross-section taken along line A-A in FIG. 5. As illustrated in FIG. 9, the first electrode 7a is provided on the second surface 6b of the first insulating substrate 6. The second electrode 19a is disposed to be adjacent to the first electrode 7a provided on the first insulating substrate 6. Further, solder 24 is provided between the second electrode 19a and the first electrode 7a. The second electrode 19a is joined to the first electrode 7a by the solder 24.

In addition, the second electrode 19b is disposed to be adjacent to the first electrode 7b. A cross-section including the second electrode 19b and the first electrode 7b is similar to the cross-section illustrated in FIG. 9. The solder 24 is provided between the second electrode 19b and the first electrode 7b. The second electrode 19b is joined to the first electrode 7b by the solder 24. Note that the second electrode 19b and the second electrode 19a are not connected by the solder 24. Further, the first electrode 7b and the first electrode 7a are not connected by the solder 24.

The other second electrodes 19c to 19i are respectively joined to the first electrodes 7c to 7i by the solder in a similar manner.

Further, in this state, the second electrodes 25a to 25i of the second insulating substrate 18 are disposed to be respectively adjacent to the first electrodes 9a to 9i provided on the first insulating substrate 6. More specifically, for example, the second electrode 25a is disposed to be adjacent to the first electrode 9a provided on the first insulating substrate 6. As illustrated in FIG. 9, solder 29 is provided between the second electrode 25a and the first electrode 9a. The second electrode 25a is joined to the first electrode 9a by the solder 29. As illustrated in FIG. 9, the first electrode 9a is provided on the second surface 6b of the first insulating substrate 6.

Further, the second electrode 25b is disposed to be adjacent to the first electrode 9b. A cross-section including the second electrode 25b and the first electrode 9b is similar to the cross-section illustrated in FIG. 9. The solder 29 is provided between the second electrode 25b and the first electrode 9b. The second electrode 25b is joined to the first electrode 9b by the solder 29. Note that the second electrode 25b and the second electrode 25a are not connected by the solder 29. The first electrode 9b and the first electrode 9a are not connected by the solder 29.

The other second electrodes 25c to 25i are respectively joined to the first electrodes 9c to 9i by the solder in a similar manner.

In the printed circuit board 1 having the above-described configuration according to Embodiment 1, the first insulating substrate 6 includes the mounting hole 15. When the y-axis direction is defined as a first direction and the x-axis direction is defined as a second direction, the second direction is orthogonal to the first direction. The mounting hole 15 is a long hole having a width that is larger in the second direction than in the first direction. Further, the first electrodes 7 and the first electrodes 9 provided on the second surface 6b of the first insulating substrate 6 are arranged at the edge of the mounting hole 15 along the x-axis direction, namely, along the second direction.

Next, a method of joining the first printed wiring board 2 illustrated in FIG. 3 having the above-described configuration and the second printed wiring board 4 illustrated in FIG. 4 and FIG. 5 having the above-described configuration, by the solder is described.

First, the second printed wiring board 4 is disposed to be orthogonal to the first printed wiring board 2. At this time, the connection portion 23 is inserted into the mounting hole 15 from the first surface 6a side, and is protruded from the second surface 6b of the first insulating substrate 6.

Next, the second surface 6b is directed downward, and the first printed wiring board 2 is fixed to a conveyance device of a flow soldering apparatus. The second printed wiring board 4 is disposed in a state standing on the first printed wiring board 2 such that the connection portion 23 protrudes downward from the first printed wiring board 2. In the flow soldering apparatus, molten solder is jetted upward from a nozzle. The first printed wiring board 2 and the second printed wiring board 4 supported by the first printed wiring board 2 are conveyed by the conveyance device, and pass across above the nozzle. When the first printed wiring board 2 passes above the nozzle, a bottom surface of the first printed wiring board 2 is immersed in the molten solder jetted from the nozzle. In addition, a portion of the second printed wiring board 4 protruding from the bottom surface of the first printed wiring board 2 is immersed in the molten solder jetted from the nozzle.

The first printed wiring board 2 is disposed such that the first electrode 7a is immersed in the molten solder from the nozzle before the first electrode 7i. In the case of the configuration example illustrated in FIG. 4 and FIG. 5, the first printed wiring board 2 is conveyed by the conveyance device in a −y-direction. Therefore, the first electrode 7i is immersed in the molten solder next to the first electrode 7h. Further, the second printed wiring board 4 is disposed such that the second electrode 19a is immersed in the molten solder from the nozzle before the second electrode 19. Therefore, the second electrode 19i is immersed in the molten solder next to the second electrode 19h.

For example, when the first electrode 7a and the second electrode 19a are immersed in the molten solder from the nozzle, the solder 24 is provided between the first electrode 7a and the second electrode 19a. Likewise, when the first electrode 7h and the second electrode 19h are immersed in the molten solder from the nozzle, the solder 24 is provided between the first electrode 7h and the second electrode 19h. When the first electrode 7i and the second electrode 19i are immersed in the molten solder from the nozzle, the solder 24 is provided between the first electrode 7i and the second electrode 19i.

For example, when the first electrode 9a and the second electrode 25a are immersed in the molten solder from the nozzle, the solder 29 is provided between the first electrode 9a and the second electrode 25a. Likewise, when the first electrode 9h and the second electrode 25h are immersed in the molten solder from the nozzle, the solder 29 is provided between the first electrode 9h and the second electrode 25h. When the first electrode 9i and the second electrode 25i are immersed in the molten solder from the nozzle, the solder 29 is provided between the first electrode 9i and the second electrode 25i.

As illustrated in FIG. 1 and FIG. 3, the first insulating substrate 6 of the first printed wiring board 2 has a rectangular shape in plan view. Substrate mounting holes 60 are provided at three of four corners of the rectangular shape. In addition, as illustrated in FIG. 1 and FIG. 3, a mold resin of the power module 30 includes module mounting holes 33. In the configuration example illustrated here, the power module 30 includes two module mounting holes 33. Further, through holes 41 are provided in the first insulating substrate 6 at portions facing the respective module mounting holes 33. A diameter of each of the through holes 41 is larger than a diameter of each of the module mounting holes 33.

As illustrated in FIG. 10, screws 42 are fastened to screw holes or the like at a mounting position of the printed circuit board 1 after the screws 42 are inserted into the module mounting holes 33 from the through holes 41 side. In addition, unillustrated screws are fastened to screw holes or the like at the mounting position after the screws are inserted into the substrate mounting holes 60. The printed circuit board 1 is mounted by at least the screws 42 that are fastening means inserted into the module mounting holes 33.

More specifically, for example, the printed circuit board 1 is mounted with a control circuit of a compressor mounting device such as an outdoor unit of an air-conditioning apparatus. The printed circuit board 1 is mounted on and fixed to a housing of such a compressor mounting device through, for example, a bracket. At this time, the heatsink 32 of the power module 30 is brought into close contact with the metal bracket and the like. This makes it possible to efficiently dissipate heat generated during operation of the power module 30.

In the printed circuit board 1 having the above-described configuration, the second insulating substrate 18 is mounted in a state perpendicularly standing on the first insulating substrate 6. At this time, the connection portion 23 provided at the end of the second insulating substrate 18 is disposed to penetrate through the mounting hole 15 from the first surface 6a side. Accordingly, most of the second insulating substrate 18, more precisely, a center of mass of the second insulating substrate 18 is disposed on the first surface 6a side of the first insulating substrate 6.

In contrast, the power module 30 that is a kind of the electronic components 3 is disposed on the second surface 6b side of the first insulating substrate 6. More precisely, a center of mass of the power module 30 is disposed on the second surface 6b side of the first insulating substrate 6. In other words, the second insulating substrate 18 and the power module 30 are disposed on sides opposite to each other of the first insulating substrate 6. In this configuration example, a weight of the power module 30 is equivalent to a weight of the second insulating substrate 18.

Therefore, unbalance caused by the second insulating substrate 18 protruding to one side of the first insulating substrate 6 is eliminated by the power module 30. In other words, the power module 30 as a kind of the electronic components 3 also has a function as a balance weight to adjust the weight balance with, in particular, the second insulating substrate 18 in the whole of the printed circuit board 1. Even it the weight of the power module 30 is not completely equivalent to the weight of the second insulating substrate 18, the power module 30 can function as the balance weight.

As described above, for example, in the case where the printed circuit board 1 is mounted on the compressor mounting device, vibration caused by operation of the compressor is transmitted to vibrate the printed circuit board 1. At this time, the first insulating substrate 6 is directly fixed to the housing or the like of the compressor mounting apparatus by a screw or the like, whereas the second insulating substrate 18 is fixed to the first insulating substrate 6 only by the solder. In addition, the second insulating substrate 18 perpendicularly protrudes from the first insulating substrate 6. Accordingly, if the weight balance of the printed circuit board 1 is biased to the second insulating substrate 18, vibration of the second insulating substrate 18 is amplified. As a result of amplification of vibration of the second insulating substrate 18, fixing between the second insulating substrate 18 and the first insulating substrate 6 by the solder may be released.

In this regard, in the printed circuit board 1 according to the present embodiment, the power module 30 also has a function as the balance weight to adjust the weight balance with, in particular, the second insulating substrate 18 in the whole of the printed circuit board 1. Accordingly, when vibration of the apparatus mounted with the printed circuit board 1 is transmitted to the printed circuit board 1, it is possible to prevent the second insulating substrate 18. Thus, it is also possible to prevent fixing between the second insulating substrate 18 and the first insulating substrate 6 by the solder from being released. Further, at this time, since it is unnecessary to provide a dedicated balance weight, the entire weight of the printed circuit board 1 is not increased.

As illustrated in FIG. 3, FIG. 5, and FIG. 6, the power module 30 as a kind of the electronic components 3 has a rectangular shape in plan view. The power module 30 has the rectangular shape having a width that is larger in the y-axis direction than in the x-axis direction. In other words, a longitudinal direction of the power module 30 and the arrangement direction of the second insulating substrate 18 are both directed in the y-axis direction and are parallel to each other. Further, the leads 31 of the power module 30 are arranged along the y-axis direction on both sides of the mold of the power module 30. Accordingly, the two lead mounting portions 50 and the mounting hole 15 are disposed to be parallel to each other along the y-axis direction.

The width of the power module 30 in the y-axis direction is equivalent to the width of the second insulating substrate 18 in the y-axis direction. The second insulating substrate 18 and the power module 30 are disposed in the above-described manner, which makes it possible to further improve the weight balance of the printed circuit board 1.

As described above, the center of mass of the second insulating substrate 18 is disposed on the first surface 6a side of the first insulating substrate 6. At this time, a distance (B illustrated in FIG. 2) between the center of mass of the second insulating substrate 18 and the first surface 6a of the first insulating substrate 6 is preferably set to be lower than or equal to a prescribed distance. More specifically, for example, the distance is preferably set to be lower than or equal to 30 mm depending on the size of each of the first insulating substrate 6 and the second insulating substrate 18. As a result, a natural frequency of the vibration of the second insulating substrate 18 with a portion where the first insulating substrate 6 and the second insulating substrate 18 are joined by the solder as a fixed end is increased, which makes it possible to prevent resonance with the vibration generated by operation of the compressor, and to reduce amplitude of the vibration of the second insulating substrate 18.

INDUSTRIAL APPLICABILITY

The present invention is usable in a printed circuit board to be provided in, for example, an outdoor unit of an air-conditioning apparatus as a compressor mounting device.

REFERENCE SIGNS LIST

1 Printed circuit board
2 First printed wiring board
3 Electronic component
4 Second printed wiring board
6 First insulating substrate
6a First surface
6b Second surface
7 First electrode
9 First electrode
15 Mounting hole
18 Second insulating substrate
18a Surface
18b Surface
19 Second electrode
23 Connection portion
24 Solder
25 Second electrode
29 Solder
30 Power module
31 Lead
32 Heatsink
33 Module mounting hole
41 Hole
42 Screw
50 Lead mounting portion
60 Substrate mounting hole

The invention claimed is:

1. A printed circuit board, comprising:
a first insulating substrate having a mounting hole therein, the mounting hole penetrating through the first insulating substrate from a first surface to a second surface and having a width larger in a second direction than in a first direction orthogonal to the second direction;
a second insulating substrate including a connection portion, the connection portion penetrating through the mounting hole from the first surface side and protruding from the second surface;
a first electrode provided on the second surface and disposed at an edge of the mounting hole along the second direction;
a second electrode provided on the connection portion and joined to the first electrode by solder; and
an electronic component provided on the second surface,
a center of mass of the second insulating substrate being disposed on the first surface side of the first insulating substrate,
a center of mass of the electronic component being disposed on the second surface side of the first insulating substrate, wherein
the electronic component has a weight equivalent to a weight of the second insulating substrate,
the electronic component is a power module that is mounted on the first insulating substrate by inserting leads into the first insulating substrate from the second surface side, and
the printed circuit board is mounted by at least fastening means inserted into a module mounting hole provided in a mold resin of the power module.

2. The printed circuit board according to claim 1, wherein a distance between the center of mass of the second insulating substrate and the first surface of the first insulating substrate is lower than or equal to 30 mm.

3. The printed circuit board according to claim 1, wherein the electronic component has a rectangular shape having a width that is larger in the second direction than in the first direction, in plan view.

4. The printed circuit board according to claim 3, wherein the width of the electronic component in the second direction is equivalent to a width of the second insulating substrate.

* * * * *